United States Patent [19]
Thomsen

[11] 4,376,605
[45] Mar. 15, 1983

[54] CAPTIVE STANDOFF BUSHING
[75] Inventor: Jack W. Thomsen, LaGrange Park, Ill.
[73] Assignee: Weckesser Co. Inc., Chicago, Ill.
[21] Appl. No.: 283,178
[22] Filed: Jul. 14, 1981
[51] Int. Cl.³ .................. F16B 5/00; F16B 37/04; H01B 17/24; H05K 7/12
[52] U.S. Cl. .................. 411/112; 174/138 D; 411/182
[58] Field of Search .......... 174/138 D, 153 G, 158 R; 361/412; 24/208 A, 213 R, 213 CS; 411/111, 112, 113, 182, 512

[56] References Cited
U.S. PATENT DOCUMENTS

| | | | |
|---|---|---|---|
| 3,890,680 | 6/1975 | Furuya | 24/208 A X |
| 4,100,368 | 7/1978 | Thomsen | 174/138 D |
| 4,286,642 | 9/1981 | Keatley | 411/112 |

FOREIGN PATENT DOCUMENTS 947551 1/1964 United Kingdom .......... 174/153 G

Primary Examiner—Laramie E. Askin

[57] ABSTRACT

A two piece tubular standoff bushing especially suited for use as a spacer for separating or stacking structural components that require isolation, with the bushing consisting of an anchor housing providing a central bore including internal restraining members and a two-walled locking member insertable therein with the restraining members projecting inwardly between the walls and behind a locking ring for fastening the standoff bushing to a structural member.

4 Claims, 5 Drawing Figures

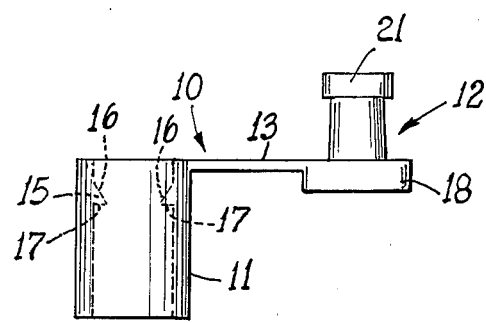
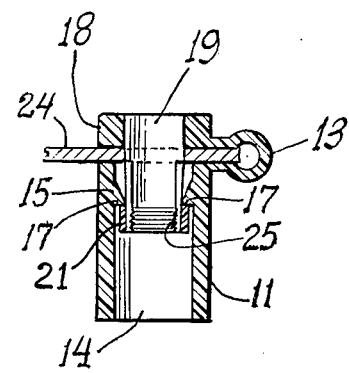
FIG 1.   FIG. 2.
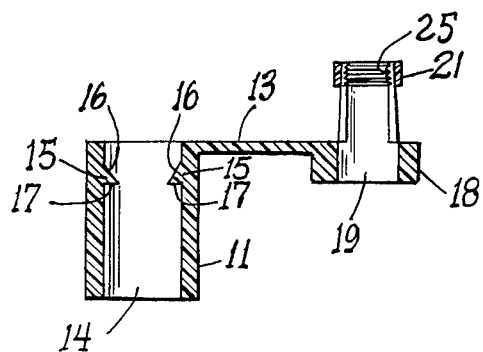
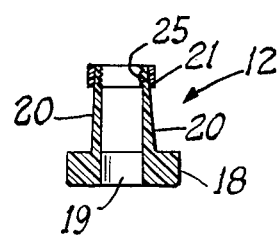
FIG. 3.   FIG. 4.
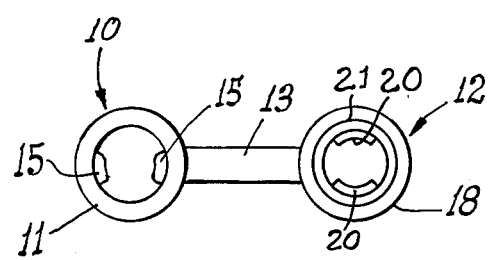
FIG. 5.

CAPTIVE STANDOFF BUSHING

SUMMARY OF THE INVENTION

This invention relates to a panel mounting means which provides electrical insulation, resiliency in the mounting, and requires no tools for installation.

The captive standoff bushing consists of a hollow cylindrical body and a cooperative insert plug with the body providing an attachment means by which the insert plug is held captive when it is inserted into the cylindrical body.

The captive standoff bushing of this invention is preferably made from an insulating plastic material which is wear-resistant and resilient. The bushing consists of two distinct parts which may be connected together by a substantially flat flexible strap and in certain installations such strap may embrace an edge portion of the panel structure which contains an aperture at the point where the mounting is to be made.

The captive standoff bushing of this invention requires no tools for installation, and once installed in the panel it will provide permanent and secured means for mounting the panel and protection from electrical contact with a base or chassis.

GENERAL DESCRIPTION OF THE DRAWINGS

FIG. 1 is a side elevational view of the bushing of this invention;

FIG. 2 is a detailed sectional view of the bushing in its assembled condition;

FIG. 3 is a side elevational sectional view of the bushing in its unattached position;

FIG. 4 is an end elevational sectional view of the insert plug of this invention; and FIG. 5 is a top plan view of the bushing in its unattached condition.

GENERAL DESCRIPTION

The captive standoff bushing 10 of this invention consists of a hollow cylindrical anchor housing 11 and an insertable locking member 12. By means of a substantially flat flexible strap 13, opposite ends of the housing 11 and locking member 12 are connected together.

As illustrated in the drawings, the anchor housing 11 provides a central bore 14 extending axially through the housing. On the wall of the center bore 14 are a pair of restraining members 15. These restraining members 15 are diametrically opposed and include an inclined wall 16 and a locking shoulder 17.

The locking member 12 provides a circular base collar 18 the diameter of which matches with that of the anchor housing 11. The base collar has formed therein an elliptically shaped bore 19.

Extending laterally from the base collar 18 and on either side of the long axis of the elliptical bore 19 are a pair of spaced apart legs 20. The outer peripheries of the legs 20 are slightly tapered inwardly and terminate into a lock ring 21 that connects the free ends of the legs 20 together.

The internal walls of the legs 20 are preferably threaded as at 25 to accept a suitable fastener as hereinafter described.

In applying the captive standoff bushing 10 to a panel structure 24, the locking member 12 is placed through an aperture formed in the panel structure 24, in the manner shown in FIG. 2.

The anchor housing 11 is then placed on the opposite side of the panel structure 24 and the lock ring 21 is inserted into the center bore 14 of the housing 11.

By supporting the lock ring 21 at the ends of the spaced apart legs 20 there is created a certain resiliency to the ring 21 such that it may be forced into an oval shape over the inclined walls 16 of the restraining members 15 until such restraining members 15 project into the spacing between the legs 20 with the lock ring 21 bearing against the locking shoulders 17 provided by the restraining members 15 as shown. The lock ring 21 will now be snapped back into its round molded configuration, and receptive, as will the threads 25 of the legs 20, to the later insertion of a standard threaded fastener or rivet for mounting the panel to a base or chassis. The threaded fastener or rivet will prevent the locking ring 21 from deforming into an oval shape and thus becoming disassociated from bearing against the locking shoulders 17.

As shown in FIG. 2, the bushing 10 has been applied to a panel structure 24 wherein the opening thereof is adjacent to one edge of the panel. In such an arrangement the flexible strap 13 is merely bent around the edge of the panel while retaining the anchor housing 11 and locking member 12 in a connected relation. This strap connection between the two parts of the bushing and around the edge of the panel prevents rotation of the bushing assembly in the panel aperture during the later installation of the standard threaded fastener.

While I have illustrated and described the preferred form of construction for carrying my invention into effect, this is capable of variation and modification without departing from the spirit of the invention. I, therefore, do not wish to be limited to the precise details of construction as set forth, but desire to avail myself of such variations and modifications as come within the scope of the appended claims.

Having thus described my invention, what I claim as new and desire to protect by Letters Patent is:

1. A captive standoff bushing for cooperating with an apertured panel member for rigidly mounting the member in a spaced or stacked isolated relation to other like apertured panel members comprising,
   (a) a tubular anchor member, having a center bore the diameter of which is greater than the aperture formed in the panel member,
   (b) a locking member including a circular base collar,
   (c) said locking member including a pair of spaced apart legs extending laterally of one side of said circular base collar,
   (d) a locking ring connecting the extremities of said spaced apart legs together, and having a diameter less than that of said bore of said tubular anchor member so as to be capable of being freely journalled therein, and
   (e) restraining means within said tubular anchor member and extending transversely to the long axis thereof adapted to project between said spaced apart legs and behind said locking ring of said locking member when said locking ring is journalled in said anchor member for locking said locking member within said tubular anchor member.

2. A captive standoff bushing as defined by claim 1, wherein said restraining means comprise diametrically opposed wall abutments restricting the diameter of the center bore of said anchor member and providing a restricted passage therebetween of a distance less than the diameter of said locking ring, said abutment having inclined wall portions in the path of said locking ring by which said locking ring is deflected as it passes into the center bore of said anchor member, and said abutments having locking shoulders for engaging complementary wall portions of said locking ring between said legs for securing said locking ring in said anchor member.

3. A captive standoff bushing as defined by claim 1, wherein said spaced apart legs are arcuated in cross section and lie within the outer periphery of said circular base collar of said locking member.

4. A captive standoff bushing as defined by claim 1, including an elongated substantially flat flexible strap connecting said locking member to said anchor member.

* * * * *